(12) United States Patent
Sun et al.

(10) Patent No.: US 9,244,093 B2
(45) Date of Patent: Jan. 26, 2016

(54) MICRO-ELECTRO-MECHANICAL SENSING DEVICE AND MANUFACTURING METHOD THEREOF

(71) Applicants: Chih-Ming Sun, Hsin-Chu (TW); Ming-Han Tsai, Hsin-Chu (TW)

(72) Inventors: Chih-Ming Sun, Hsin-Chu (TW); Ming-Han Tsai, Hsin-Chu (TW)

(73) Assignee: PIXART IMAGING INCORPORATION, R.O.C., Hsin-Chu (TW)

( * ) Notice: Subject to any disclaimer, the term of this patent is extended or adjusted under 35 U.S.C. 154(b) by 372 days.

(21) Appl. No.: 13/688,099

(22) Filed: Nov. 28, 2012

(65) Prior Publication Data
US 2013/0152688 A1 Jun. 20, 2013

(30) Foreign Application Priority Data
Dec. 14, 2011 (TW) .............................. 100146103 A (51) Int. Cl.
| | |
|---|---|
| G01P 15/08 | (2006.01) |
| G01P 15/09 | (2006.01) |
| G01P 15/00 | (2006.01) |
| B81C 1/00 | (2006.01) |
| G01P 15/125 | (2006.01) |

(52) U.S. Cl.
CPC .......... *G01P 15/0802* (2013.01); *B81C 1/0015* (2013.01); *G01P 15/00* (2013.01); *G01P 15/09* (2013.01); *G01P 15/0922* (2013.01); *G01P 15/125* (2013.01); *B81B 2201/025* (2013.01); *G01P 2015/0837* (2013.01)

(58) Field of Classification Search
CPC ................ G01P 2015/0822; G01P 2015/0825; G01P 2015/0828
See application file for complete search history.

(56) References Cited

U.S. PATENT DOCUMENTS

| | | | |
|---|---|---|---|
| 2006/0169041 A1* | 8/2006 | Madni et al. ................ | 73/504.02 |
| 2007/0024395 A1* | 2/2007 | Motai ........................... | 333/189 |
| 2008/0138922 A1* | 6/2008 | Wan .............................. | 438/52 |

\* cited by examiner

*Primary Examiner* — Paul West
(74) *Attorney, Agent, or Firm* — Tung & Associates (57) ABSTRACT

A micro-electro-mechanical sensing device including a substrate, a semiconductor layer, a supporting pillar, a first suspended arm, a connecting member, a second suspended arm, and a proof mass is provided. The semiconductor layer is disposed on or above the substrate. The supporting pillar is disposed on or above the semiconductor layer. The first suspended arm is disposed on the supporting pillar. The supporting connects a portion of the first suspended arm. The connecting member directly or indirectly connects another portion of the first suspended arm. The second suspended arm has a first surface and a second surface opposite to the first surface. The connecting member connects a portion of the first surface. The proof mass connects the second suspended arm and it includes a portion of the second suspended arm as a portion of the proof mass. A method for manufacturing the device is also provided.

19 Claims, 10 Drawing Sheets

MICRO-ELECTRO-MECHANICAL SENSING DEVICE AND MANUFACTURING METHOD THEREOF

CROSS REFERENCE

The present invention claims priority to TW 100146103, filed on Dec. 14, 2011.

BACKGROUND OF THE INVENTION

1. Field of Invention

The present invention relates to a sensing device, especially a micro-electro-mechanical sensing device and a manufacturing method thereof.

2. Description of Related Art

MEMS (Micro-Electro-Mechanical System) technology has opened up a whole new technology and industry; such technology is widely used in various fields. MEMS inertial sensors are a typical example of such technology, which for example include accelerometers and gyroscopes. In these sensors, a MEMS spring structure is usually required to fix one end of a moving structure on a side wall, so that this moving structure is capable of reciprocating motion in a specific direction. The related spring structure is usually composed by a stack of silicon layers or metal layers and oxide layers in alternative order.

However, due to different thermal expansion coefficients between the metal layer and the oxide layer, the high temperature process will result in thermal expansions of different degrees on the metal layer and the oxide layer, which cause the MEMS spring structure to distort and affect their performance. Therefore, how to prevent the MEMS spring structure from deformation affected by environment temperature changes and ensure good performance of the MEMS spring structure are important topics to this field.

Besides, in prior art, the MEMS spring is usually designed in the form of a horizontal layout, so the area left for other components on a substrate is reduced. In other words, how to effectively improve the area utilization efficiency or reduce the device size are important topics to this field.

SUMMARY OF THE INVENTION

The present invention provides a micro-electro-mechanical sensing device; the micro-electro-mechanical sensing device can effectively improve the substrate area utilization and reduce the influence of stress and thermal effects.

The present invention also provides a method of manufacturing a micro-electro-mechanical sensing device, having the benefits of simple process steps and lower production cost.

The above and other objectives and advantages of the present invention can be further understood from the disclosed technical features in the invention.

According to the above or other objectives, one preferable embodiment of the present invention provides a micro-electro-mechanical sensing device, which includes a substrate, a semiconductor layer, a supporting pillar, a first suspended arm, a first connecting member, a second suspended arm, and a proof mass. The semiconductor layer is disposed on or above the substrate. The supporting pillar is disposed on or above semiconductor layer. The first suspended arm is disposed on or above the supporting pillar, and the supporting pillar connects a portion of the first suspended arm. The first connecting member connects directly or indirectly to another portion of the first suspended arm. The second suspended arm includes a first surface and a second surface opposite to the first surface, and the first connecting member connects a portion of the first surface. The proof mass connects the second suspended arm, and it includes a portion of the second suspended arm as a portion of the proof mass.

In a preferable embodiment of the present invention, the first suspended arm includes a third surface and a fourth surface opposite to the third surface, and the supporting pillar connects a portion of the third surface.

In a preferable embodiment of the present invention, the first connecting member connects directly to a portion of the fourth surface or another portion of the third surface. In an embodiment of the present invention, when the first connecting member connects directly to another portion of the third surface, the first connecting member is at a same elevation level as at least a portion of the supporting pillar. In another preferable embodiment of the present invention, when the first connecting member connects directly to a portion of the fourth surface, the proof mass has a portion which is at a same elevation level as a portion of the first connecting member.

In a preferable embodiment of the present invention, the micro-electro-mechanical sensing device further includes a second connecting member and a third suspended arm. The second connecting member directly connects another portion of the third surface of the first suspended arm. The third suspended arm includes a fifth surface and a sixth surface opposite to the fifth surface, and the second connecting member connects a portion of the fifth surface, wherein the first connecting member connects another portion of the fifth surface such that the first connecting member connects indirectly to another portion of the first suspended arm. In an embodiment of the present invention, the first connecting member and the second connecting member are at a same elevation level as at least a portion of the supporting pillar. In an embodiment of the present invention, the proof mass has a portion which is at a same elevation level as a portion of the first connecting member, a portion of the second connecting member, or a portion of the supporting pillar layer.

In a preferable embodiment of the present invention, each of the supporting pillar, the first connecting member, and the proof mass includes at least two conductive layers.

In a preferable embodiment of the present invention, the proof mass includes a dielectric layer or a gap between the conductive layers.

In a preferable embodiment of the present invention, the micro-electro-mechanical sensing device further includes an etching barrier structure which surrounds the supporting pillar, the first suspended arm, the first connecting member, the second suspended arm, and the proof mass. In an embodiment of the present invention, the etching barrier structure includes a stacked structure having at least two conductive layers. In an embodiment of the present invention, the etching barrier structure includes layers having same elevation levels as the semiconductor layer, the supporting pillar, the first suspended arm, the first connecting member, the second suspended arm, and the proof mass.

In a preferable embodiment of the present invention, the micro-electro-mechanical sensing device further includes a top electrode, which is disposed above the proof mass.

In a preferable embodiment of the present invention, the micro-electro-mechanical sensing device further includes a bottom electrode, which is disposed beneath the proof mass.

In a preferable embodiment of the present invention, the micro-electro-mechanical sensing device further includes a piezoelectric layer, which is disposed on the second suspended arm.

In a preferable embodiment of the present invention, the materials of second suspended arm include a piezoelectric material.

In another preferable embodiment of the present invention, a method of manufacturing a micro-electro-mechanical sensing device at least comprises the steps of: providing a substrate; forming a semiconductor material layer on or above the substrate; patterning the semiconductor material layer to form a semiconductor layer on or above the substrate; repeatedly forming a dielectric layer, a patterned metal layer, and a second patterned metal layer on or above the substrate, wherein each first patterned metal layer physically connects the second patterned metal layer or the semiconductor layer through at least one opening of each dielectric layer; and removing the dielectric layers on or above the substrate to form a supporting pillar, a first suspended arm, a first connecting member, a second suspended arm, and a proof mass on or above the substrate. The supporting pillar is disposed on or above the semiconductor layer. The first suspended arm is disposed on or above the supporting pillar, and the supporting pillar connects a portion of the first suspended arm. The first connecting member directly or indirectly connects another portion of the first suspended arm. The second suspended arm includes a first surface and a second surface opposite to the first surface, and the first connecting member connects a portion of the first surface. The proof mass connects the second suspended arm, and the proof mass includes a portion of the second suspended arm as a portion of the proof mass.

In a preferable embodiment of the present invention, the first suspended arm and the second suspended arm are formed by one or more of the second patterned metal layers which are at the same or different elevation levels with reference to the substrate.

In a preferable embodiment of the present invention, the supporting pillar, the first connecting member, or the proof mass includes at least one of the first patterned metal layers and at least one of the second patterned metal layers.

In a preferable embodiment of the present invention, the first suspended arm includes a third surface and a fourth surface opposite to the third surface, and the supporting pillar connects a portion of the third surface.

In a preferable embodiment of the present invention, the method of manufacturing micro-electro-mechanical sensing device further comprises: forming a second connecting member and a third suspended arm after removing the dielectric layers on or above the substrate. The second connecting member directly connects another portion of the third surface of the first suspended arm. The third suspended arm includes a fifth surface and a sixth surface opposite to the fifth surface, and the second connecting member connects a portion of the fifth surface. The first connecting member connects another portion of the fifth surface, such that the first connecting member indirectly connects another portion of the first suspended arm.

In a preferable embodiment of the present invention, the method of manufacturing micro-electro-mechanical sensing device further comprises: forming an electrode after removing the dielectric layers on or above the substrate, wherein the electrode is disposed above or beneath the proof mass, and the electrode and the proof mass respectively include different second patterned metal layers of different elevation levels.

According to the above, the micro-electro-mechanical sensing device according to the present invention has a flexible structure which connects the first suspended arm and the second suspended arm at different elevation levels to the proof mass by a connecting member which utilizes the Z-axis space. In this way, the utilization efficiency of the substrate surface area can be effectively improved, and the thermal and stress impacts on the flexible structure can be reduced. In addition, the flexible structure can be manufactured by a standard CMOS process, so the process of manufacturing the micro-electro-mechanical sensing device is simplified and the cost is reduced.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, but not drawn according to actual scale. The orientation wordings in the description such as: top, bottom, on, above, beneath, left, and right are for reference to the figures only, but not for limiting the actual product made according to the present invention.

Figure 1:
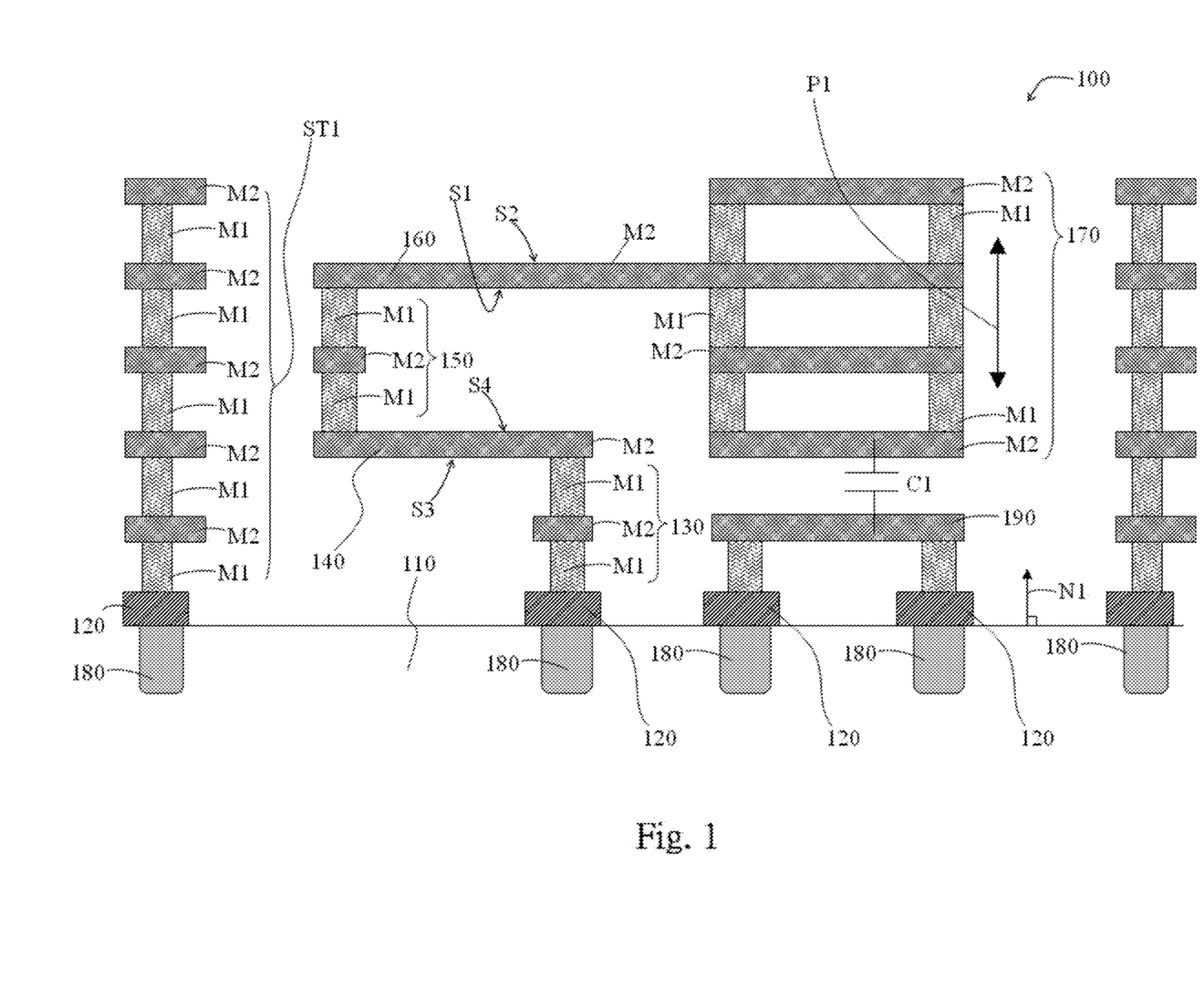
FIG. 1 shows a partial cross-section view of a micro-electro-mechanical sensing device according to an embodiment of the present invention.

FIG. 1 shows a partial cross-section view of a preferable embodiment of a micro-electro-mechanical sensing device provided by the present invention. The micro-electro-mechanical sensing device includes a substrate 110, a semiconductor layer 120, a supporting pillar 130, a first suspended arm 140, a first connecting member 150, a second suspended arm 160, and a proof mass 170, in which the supporting pillar 130, the first suspended arm 140, the first connecting member 150, the second suspended arm 160 and the proof mass 170 can be formed by repeatedly stacking a first patterned metal layer M1 and a second patterned metal layer M2. That is, each of the supporting pillar 130, the first suspended arm 140, the first connecting member 150, the second suspended arm 160, and the proof mass 170 can include at least one of the first patterned metal layer M1 and the second patterned metal layer M2.

In this embodiment, the semiconductor layer 120 is disposed on or above in the substrate 110, wherein the substrate 110 may be a P-type semiconductor substrate, and the semiconductor layer 120 may be a polycrystalline material. As a specific example, the substrate 110 and the semiconductor layer 120 can be made of the same material, such as silicon. That is, the substrate 110 can be a P-type silicon substrate, and the semiconductor layer 120 can be made of polysilicon. In another embodiment, the substrate 110 can be an N-type semiconductor substrate, which can be determined depending on user's requirements. In detail, when the semiconductor layer 120 is made of polysilicon, it will have a resistance relatively larger than a conductor, and thus it can be for insulation to avoid unnecessary electrical connection. In addition, for even better insulation, ions with a different conductivity to the substrate 110 can be doped beneath the semiconductor layer 120, such as N-type ions, to form an N type well 180.

FIG. 1 shows that the supporting pillar 130 is disposed on or above the semiconductor layer 120. In this embodiment, the supporting pillar 130 can be a stacked structure formed by one or more first patterned metal layers M1 and one or more second patterned metal layers M2, to form a conductive supporting structure, as shown in FIG. 1. For example, this embodiment uses tungsten for the material of the first patterned metal layer M1, and aluminum for the material of the second patterned metal layer M2. In other embodiments, the first patterned metal layer M1 and the second patterned metal layer M2 material can be made of or include other appropriate materials, such as: gold, silver, copper, tin, lead, hafnium, tungsten, molybdenum, neodymium, titanium, tantalum, zinc and other metals.

The first suspended arm 140 is disposed on the supporting pillar 130, and the supporting pillar 130 connects a portion of the first suspended arm 140, as shown in FIG. 1. More specifically, the first suspended arm 140 have a third surface S3 and a third surface S3 opposite to the fourth surface S4, and the supporting pillar 130 connects a portion of the third surface S3. In this embodiment, the first suspended arm 140 can include one or more of the second patterned metal layers M2. The material of the first suspended arm 140 can be or include gold, silver, copper, tin, lead, hafnium, molybdenum, neodymium, titanium, tantalum, aluminum, zinc, and other metals. Aluminum is used in this embodiment, but the present invention is not limited to it.

Still referring to FIG. 1, the first connecting member 150 can directly or indirectly connect another portion of the first suspended arm 140. An example of direct connection is shown, and an example of indirect connection will be explained later. In this embodiment, the first connecting member 150 connects directly to a portion of the fourth surface S4 of the first suspended arm 140, and the first connecting member 150 can be a stacked structure including one or more first patterned metal layers M1 and one or more second patterned metal layer M2, to form a conductive connecting structure as shown in FIG. 1. It should be noted that the supporting pillar 130 and the first connecting member 150 are respectively disposed at different elevation levels with reference to the substrate 110, that is, the first connecting member 150 is above the supporting pillar 130 with reference to the substrate 110.

The second suspended arm 160 includes a first surface S1 and a second surface S2 opposite to the first surface S1, and the first connecting member 150 connects a portion of the first surface S1 of the second suspended arm 160 as shown in FIG. 1. In this embodiment, the second suspended arm 160 can include one or more of the second patterned metal layers M2, and the material of the second suspended arm 160 can be or include gold, silver, copper, tin, lead, hafnium, molybdenum, neodymium, titanium, tantalum, aluminum, zinc, and other conductive material, such as but not limited to metals. Aluminum is used in this embodiment, but the present invention is not limited to it. It should be noted that the first suspended arm 140 and the second suspended arm 160 are respectively disposed at different elevation levels with reference to the substrate 110, that is, the second suspended arm 160 is above the first suspended arm 140 with reference to the substrate 110.

Still referring to FIG. 1, the proof mass 170 connects the second suspended arm 160, and the proof mass 170 includes a portion of the second suspended arm 160, as a portion of the proof mass 170. In this embodiment, at least one or more portions M1 and M2 of the proof mass 170 are selectively disposed at the same elevation levels as at least one or more portions M1 and M2 of the first connecting member 150, as shown in FIG. 1. In this embodiment, a gap or a dielectric layers 120a (shown in FIG. 7 and explained later) can be selectively provided between these conductive layers M1 and M2.

In addition, the micro-electro-mechanical sensing device 100 preferably further includes a bottom electrode 190, which is disposed beneath the proof mass 170 and forms a capacitor C1 with the second patterned metal layer M2 at the bottom of the proof mass 170, as shown in FIG. 1. In detail, when the proof mass 170 receives an external force and moves along the direction P1 (such as a direction parallel to a direction N1 normal to the substrate 110), the capacitance of the capacitor C1 formed by the proof mass 170 and the bottom electrode 190 will change, so that an acceleration caused by the force can be calculated. In other words, the micro-electro-mechanical sensing device 100 according to this embodiment can be a Z-axis accelerometer (Z-axis is the axis parallel to the direction N1 normal to the substrate 110). In particular, the flexible structure for connecting the proof mass 170 includes the flexible structure 150, which extends in the Z-axis direction to connect the first suspended arm 140 and the second suspended arm 160 at different elevation levels, so that the space in the Z-axis is efficiently used and the device occupies less horizontal area on or above the substrate 110, and furthermore it reduces the stress and thermal impacts on this flexible structure as well.

Preferably, the micro-electro-mechanical sensing device 100 includes an etching barrier structure ST1, which surrounds the supporting pillar 130, the first suspended arm 140, the first connecting member 150, the second suspended arm 160, and the proof mass 170, as shown in FIG. 1. In this embodiment, the etching barrier structure is a stacked structure including one or more first patterned metal layers M1 and one or more second patterned metal layers M2. Specifically, the etching barrier structure ST1 include layers having the same elevation levels as the semiconductor layer 120, the supporting pillar 130, the first suspended arm 140, the first connecting member 150, the second suspended arm 160, and the layers M1 and M2 of the proof mass 170. In other words, the etching barrier structure ST1 is a metal stack, which encompasses the periphery of the supporting pillar 130, the first suspended arm 140, the first connecting member 150, the second suspended arm 160, and the proof mass 170. Thus, the dielectric layers within the area surrounded by the etching barrier structure ST1 can be etched away, to form the first suspended arm 140, the second suspended arm 160, and the proof mass 170 which are suspended structures.

Figure 2:
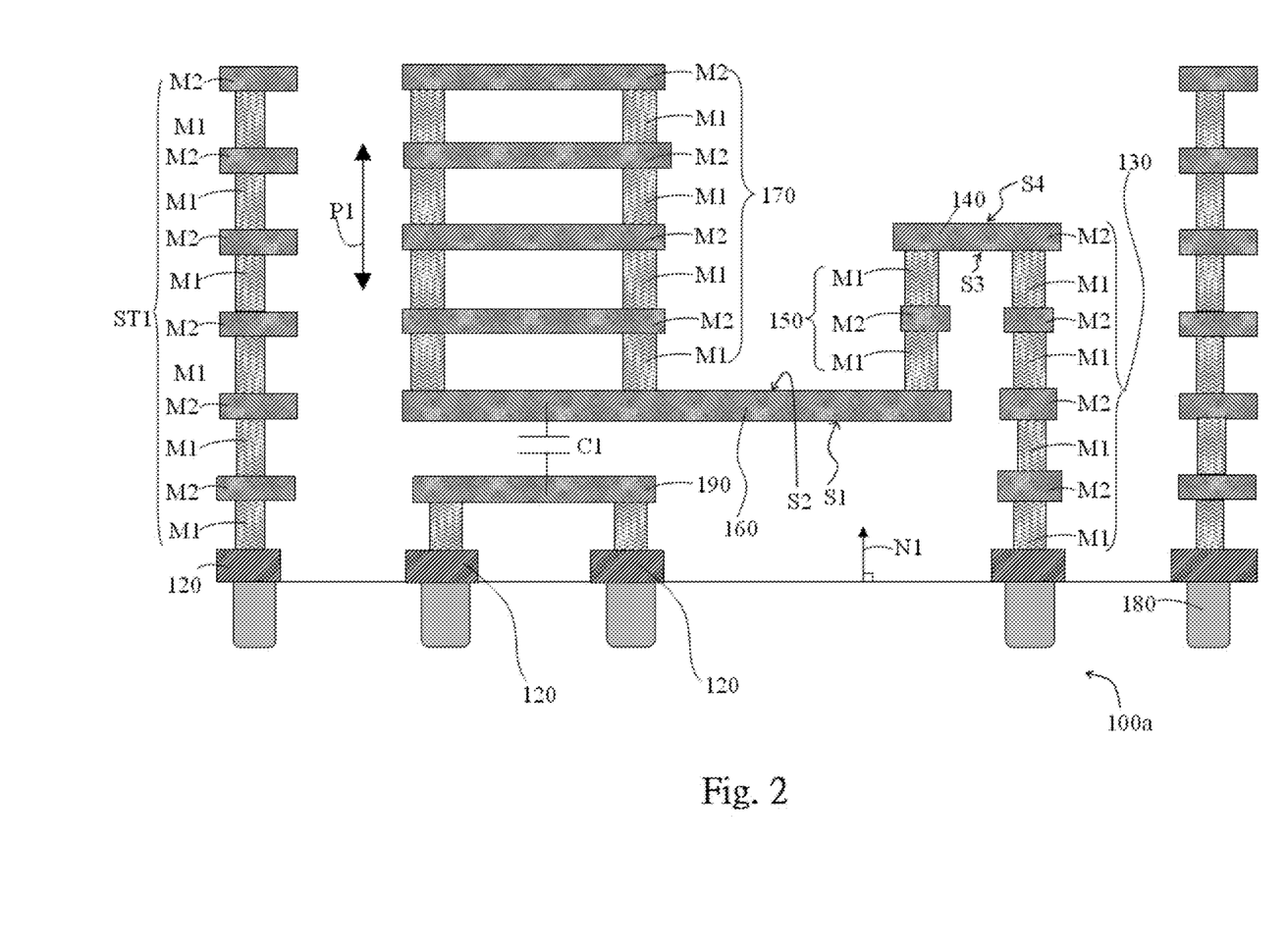
FIG. 2 shows a partial cross-section view of a micro-electro-mechanical sensing device according to another embodiment of the present invention.

FIG. 2 illustrates a partial cross-section view of another embodiment of the micro-electro-mechanical sensing device according to the present invention. Referring to FIG. 1 and FIG. 2 simultaneously, the micro-electro-mechanical sensing device 100a of the present embodiment is similar to the micro-electro-mechanical sensing device 100 of the previous embodiment in concept, but is different in that: the first connecting member 150 connects directly to another portion of the third surface S3 of the first suspended arm 140, wherein the layers M1 and M2 of the first connecting member 150 are at the same elevation levels as at least some of the layers M1 and M2 of the supporting pillar 130, as shown in FIG. 2.

Similarly, in the micro-electro-mechanical sensing device 100a, when the proof mass 170 receives an external force and moves along the direction P1 (such as a direction parallel to a direction N1 normal to the substrate 110), the capacitance of the capacitor C1 formed by the proof mass 170 and the bottom electrode 190 will change, so that an acceleration caused by the force can be calculated. In other words, this embodiment of the micro-electro-mechanical sensing device 100a also can be a Z-axis accelerometer. Since the micro-electro-mechanical sensing device 100a is similar in concept to the foregoing micro-electro-mechanical sensing device 100, it provides similar benefits to the foregoing micro-electro-mechanical sensing device 100 and the details are not repeated here.

Figure 3:
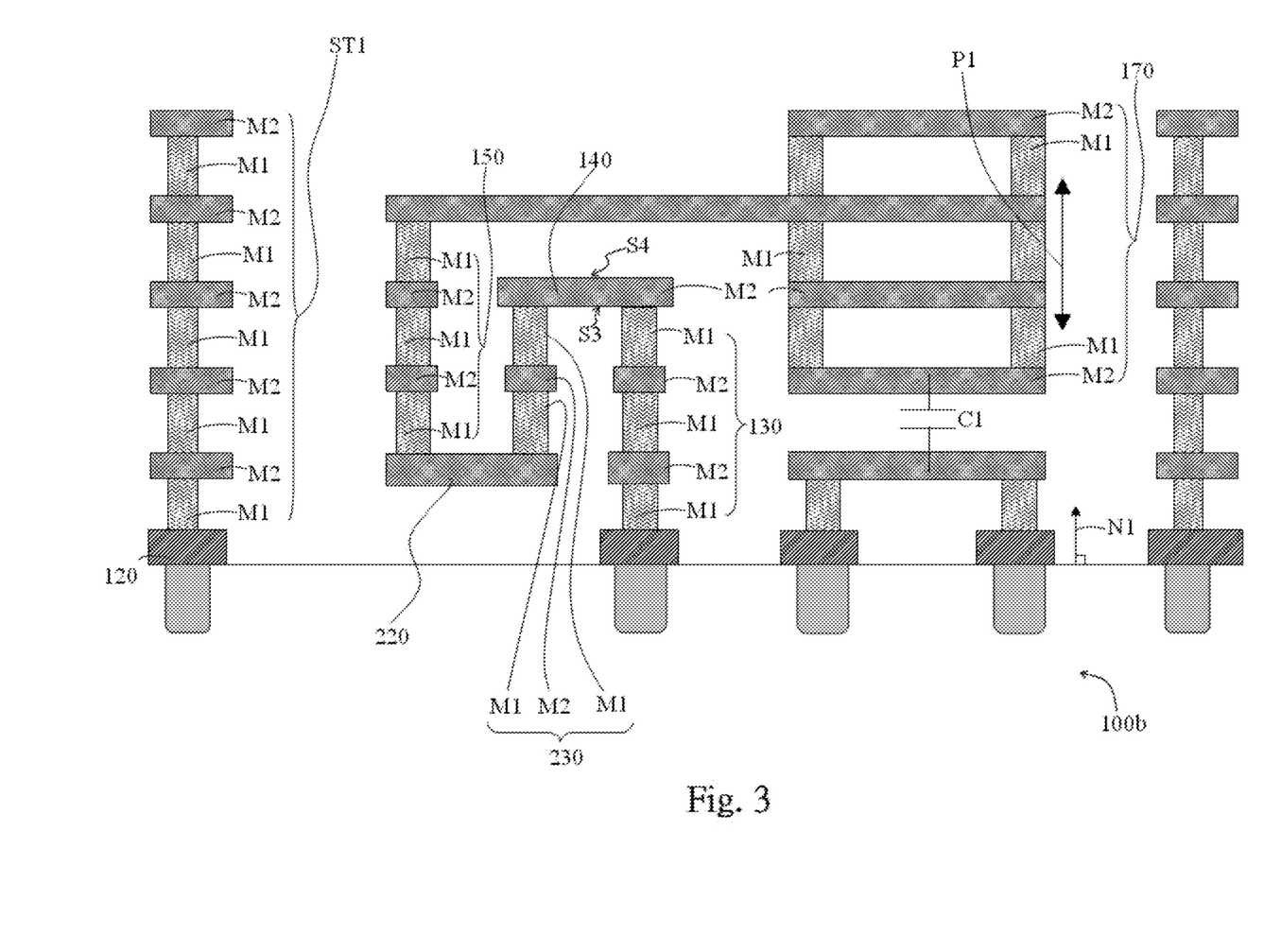
FIG. 3 shows a partial cross-section view of a micro-electro-mechanical sensing device according to another embodiment of the present invention.

FIG. 3 shows a partial cross-section view of another embodiment of the invention-based micro-electro-mechanical sensing device according to the present invention. Referring to FIG. 1 and FIG. 3 simultaneously, the micro-electro-mechanical sensing device 100b of the present embodiment is similar to the foregoing micro-electro-mechanical sensing device 100 in concept, but is different in that: the micro-electro-mechanical sensing device 100b further includes a second connecting member 210 and a third suspended arm 220. More specifically, the second connecting member 210 connects directly to another portion of the third surface S3 of the first suspended arm 140; the third suspended arm 220 includes a fifth surface S5 and a sixth surface S6 opposite to the fifth surface S5, and the second connecting member 210 also connects to a portion of the fifth surface S5 of the third suspended arm 220. In this embodiment, the first connecting member 150 connects to another portion of the fifth surface S5. Therefore, the first connecting member 150 indirectly connects to another portion of the first suspended arm 140.

In the micro-electro-mechanical sensing device 100b, the layers M1 and M2 of the first connecting member 150 and the layers M1 and M2 of the second connecting member 210 are at least at the same elevation levels to some of the layers M1 and M2 of the supporting pillar 130. Besides, some of the layers M1 and M2 of the proof mass 170 can be selectively at the same elevation levels as some of the layers M1 and M2 of the first connecting member 150, some of the layers M1 and M2 of the second connecting member 210, or some of the layers M1 and M2 of the supporting pillar 130.

Similarly, in the micro-electro-mechanical sensing device 100b, when the proof mass 170 receives an external force and moves along the direction P1 (such as a direction parallel to a direction N1 normal to the substrate 110), the capacitance of the capacitor C1 formed by the proof mass 170 and the bottom electrode 190 will change, and an acceleration caused by the force can be calculated. In other words, this embodiment of the micro-electro-mechanical sensing device 100b also can be a Z-axis directional accelerometer. Since the micro-electro-mechanical sensing device 100b is similar in concept to the foregoing micro-electro-mechanical sensing device 100, it provides similar benefits to the foregoing micro-electro-mechanical sensing device 100 and the details are not repeated here.

Figure 4:
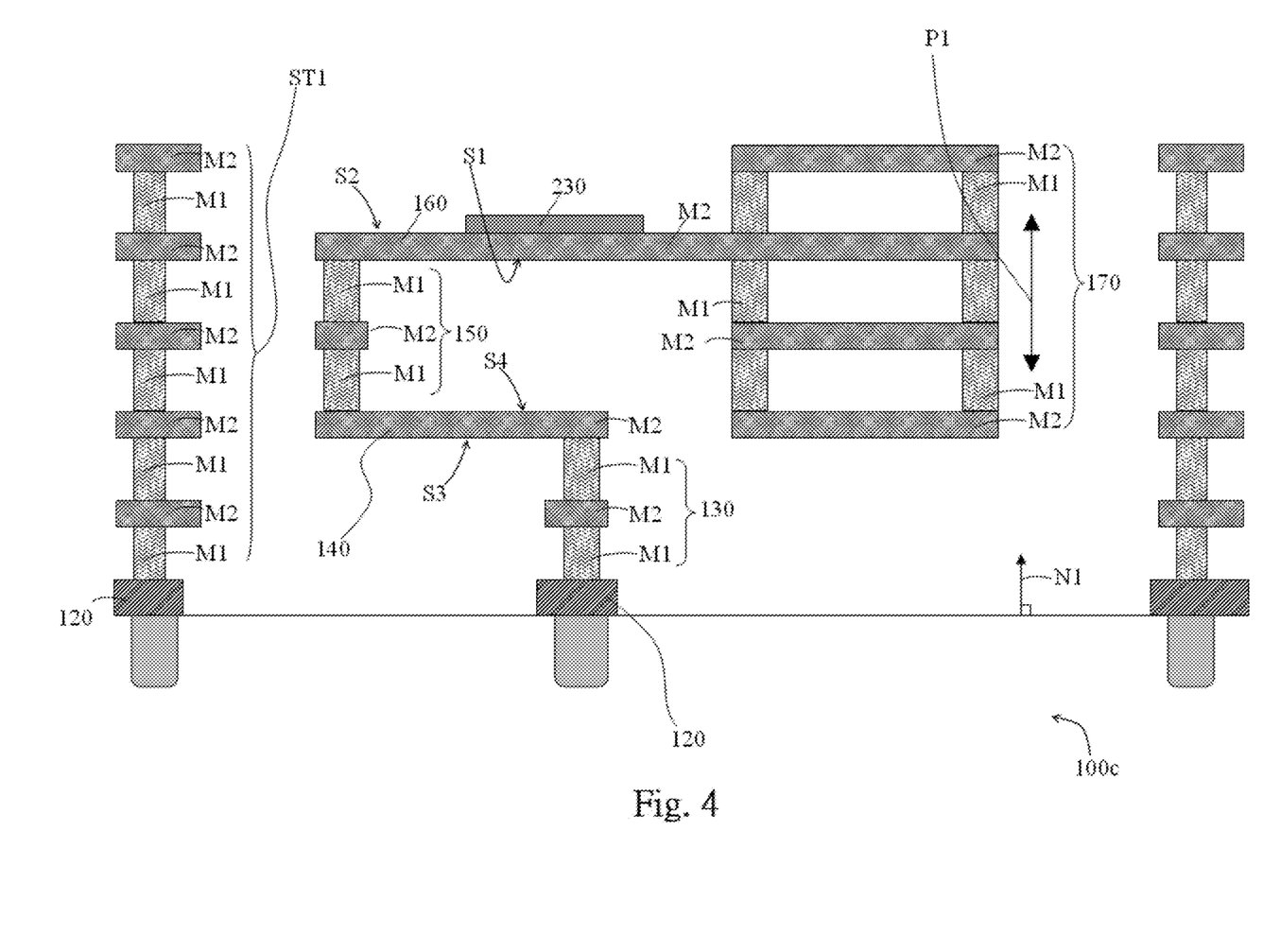
FIG. 4 shows a partial cross-section view of a micro-electro-mechanical sensing device according to another embodiment of the present invention.

FIG. 4 shows a partial cross-section view of another embodiment of the micro-electro-mechanical sensing device. Referring to FIG. 1 and FIG. 4 simultaneously, the micro-electro-mechanical sensing device 100c of the present embodiment is similar to the foregoing micro-electro-mechanical sensing device 100 in concept, but is different in that: the micro-electro-mechanical sensing device 100c includes a piezoelectric or piezoresistic layer 230, and the bottom electrode 190 is not required. The piezoelectric or piezoresistic layer 230 is disposed on the second suspended arm 160, as shown in FIG. 4.

More specifically, when the proof mass 170 receives an external force and moves along the direction P1 (such as a direction parallel to a direction N1 normal to the substrate 110), the piezoelectric layer 230 disposed on the second suspended arm 160 will deform accordingly to generate different electrical performances, and the acceleration caused by the external force can be determined by the different electrical performances. In other words, this embodiment of the micro-electro-mechanical sensing device 100c also can be a Z-axis accelerometer. Since the micro-electro-mechanical sensing device 100c is similar in concept to the foregoing micro-electro-mechanical sensing device 100, it provides similar benefits to the foregoing micro-electro-mechanical sensing device 100 and the details are not repeated here.

Figure 5:
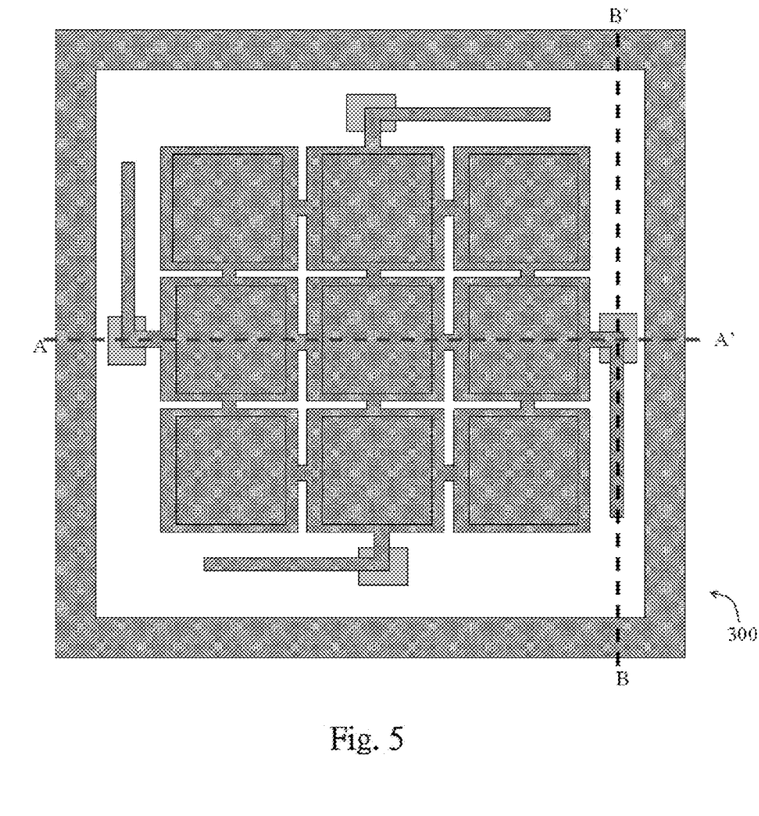
FIG. 5 shows a partial top view of a micro-electro-mechanical sensing device according to another embodiment of the present invention.
Figure 6A:
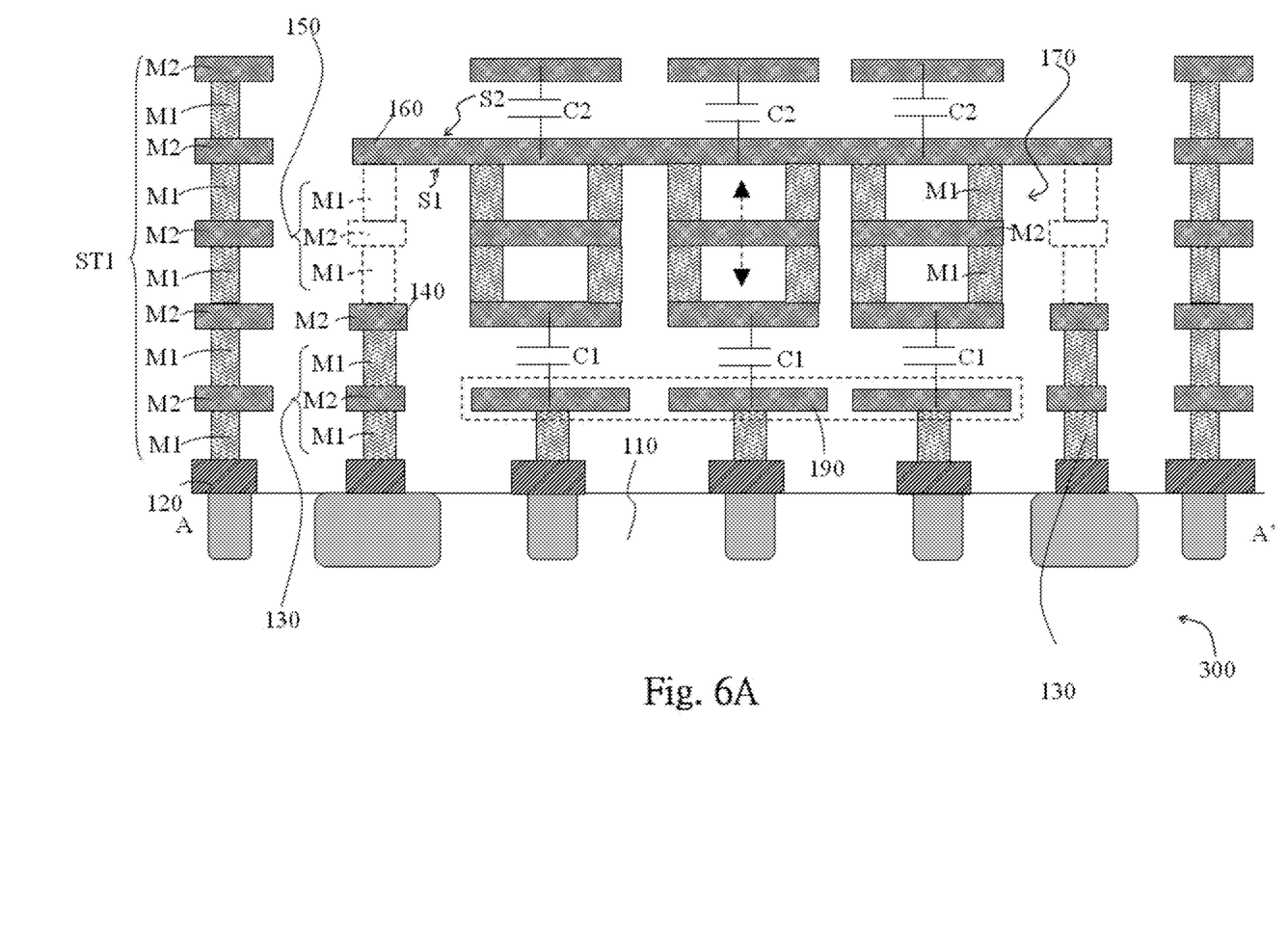
FIG. 6A shows a cross-section view of the micro-electro-mechanical sensing device according to AA' cross section line of FIG. 5.
Figure 6B:
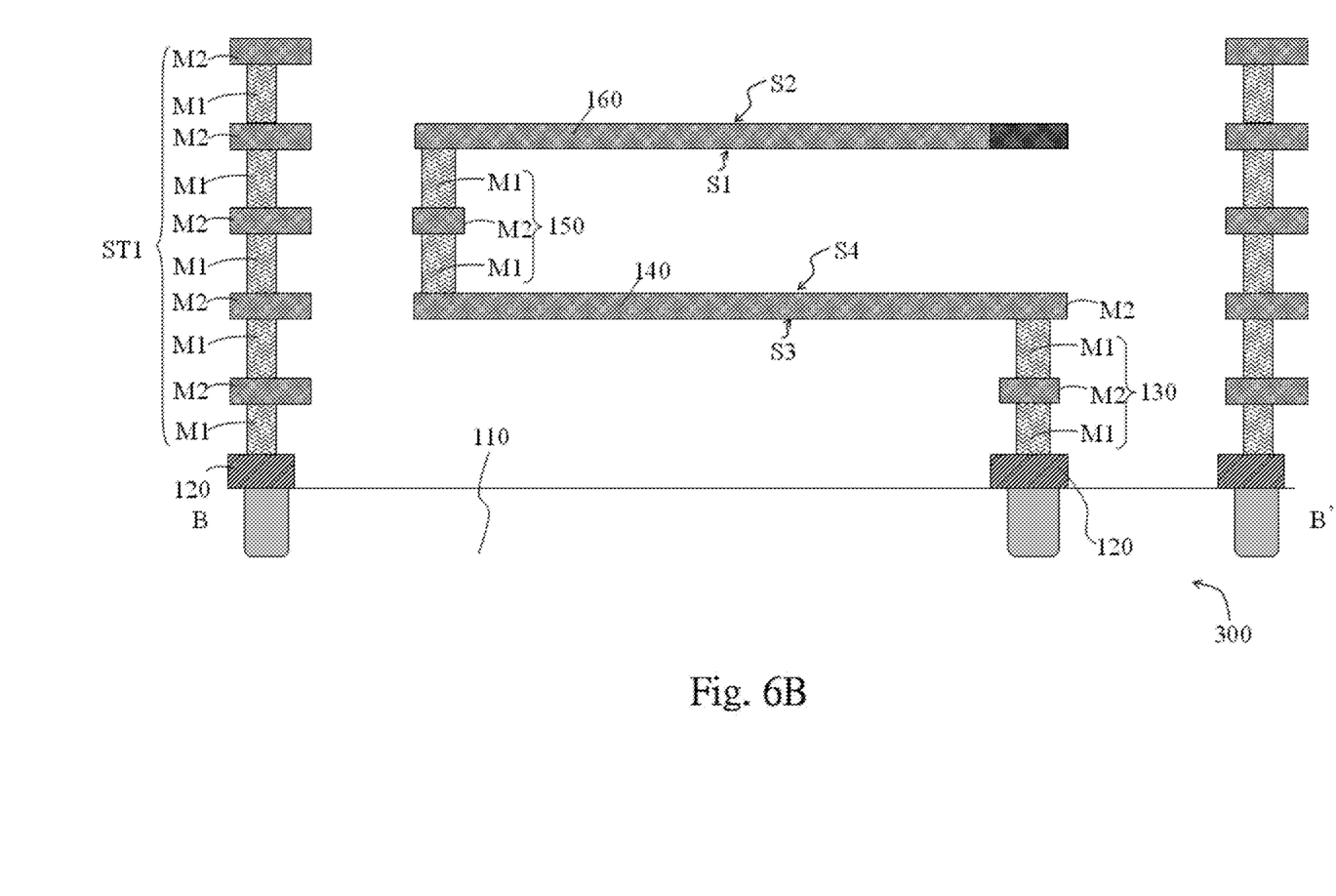
FIG. 6B shows a cross-section view of the micro-electro-mechanical sensing device according to BB' cross section line of FIG. 5.

FIG. 5 shows a partial top view of yet another embodiment of the micro-electro-mechanical sensing device according to the present invention. FIG. 6A shows a cross-section view of the micro-electro-mechanical sensing device according to AA' cross section line in FIG. 5, and FIG. 6B shows a cross-section view of the micro-electro-mechanical sensing device according to BB' cross section line in FIG. 5. Referring to FIG. 1, FIG. 5, FIG. 6A, and FIG. 6B simultaneously, the micro-electro-mechanical sensing device 300 of the present embodiment is similar to the foregoing micro-electro-mechanical sensing device 100 in concept and structure, but provides more functions for broader applications. Specifically, the micro-electro-mechanical sensing device 300 system includes four flexible structures 310 to connect and sustain nine proof masses 170, and the flexible structures 310 are respectively disposed at four opposite sides. More specifically, each flexible structure 310 includes the aforementioned semiconductor layer 120, supporting pillar 130, first suspended arm 140, first connecting member 150, and second suspended arm 160, wherein the proof mass 170 is connected to the second suspended arm 160 as shown in FIG. 5, FIG. 6A, and FIG. 6B. Besides the aforementioned bottom electrode structure 190, the micro-electro-mechanical sensing device 300 preferably further includes a top electrode 240, wherein the top electrode 240 is disposed above the proof masses 170 and forms a capacitor C2 with the topmost second patterned metal layer M2 of the proof masses 170. Thus, when the micro-electro-mechanical sensing device 300 moves receives an external force and moves along the direction P1 (such as a direction parallel to a direction N1 normal to the substrate 110), the capacitance of the capacitors C2 and C1 formed respectively between the proof masses 170 and the top electrode 240 and between the proof masses 170 and the bottom electrode 190 will change accordingly, so an acceleration caused by the external force can be calculated.

In the micro-electro-mechanical sensing device 300, because each flexible structure 310 is similar to the foregoing micro-electro-mechanical sensing device 100 in concept and connection, the micro-electro-mechanical sensing device 300 can effectively reduce the occupied horizontal area on or above the substrate 110 (i.e. effectively improving the utilization of the substrate), and reduce the stress and thermal impacts on the flexible structure.

According to the above, the present invention also provides a method of manufacturing the micro-electro-mechanical sensing devices 100, 100a-100c, and 300. The following embodiment will take the micro-electro-mechanical sensing device 100 for example, but the same method can be applied to manufacturing the micro-electro-mechanical sensing devices 100a-100c and 300 as well.

Figure 7:
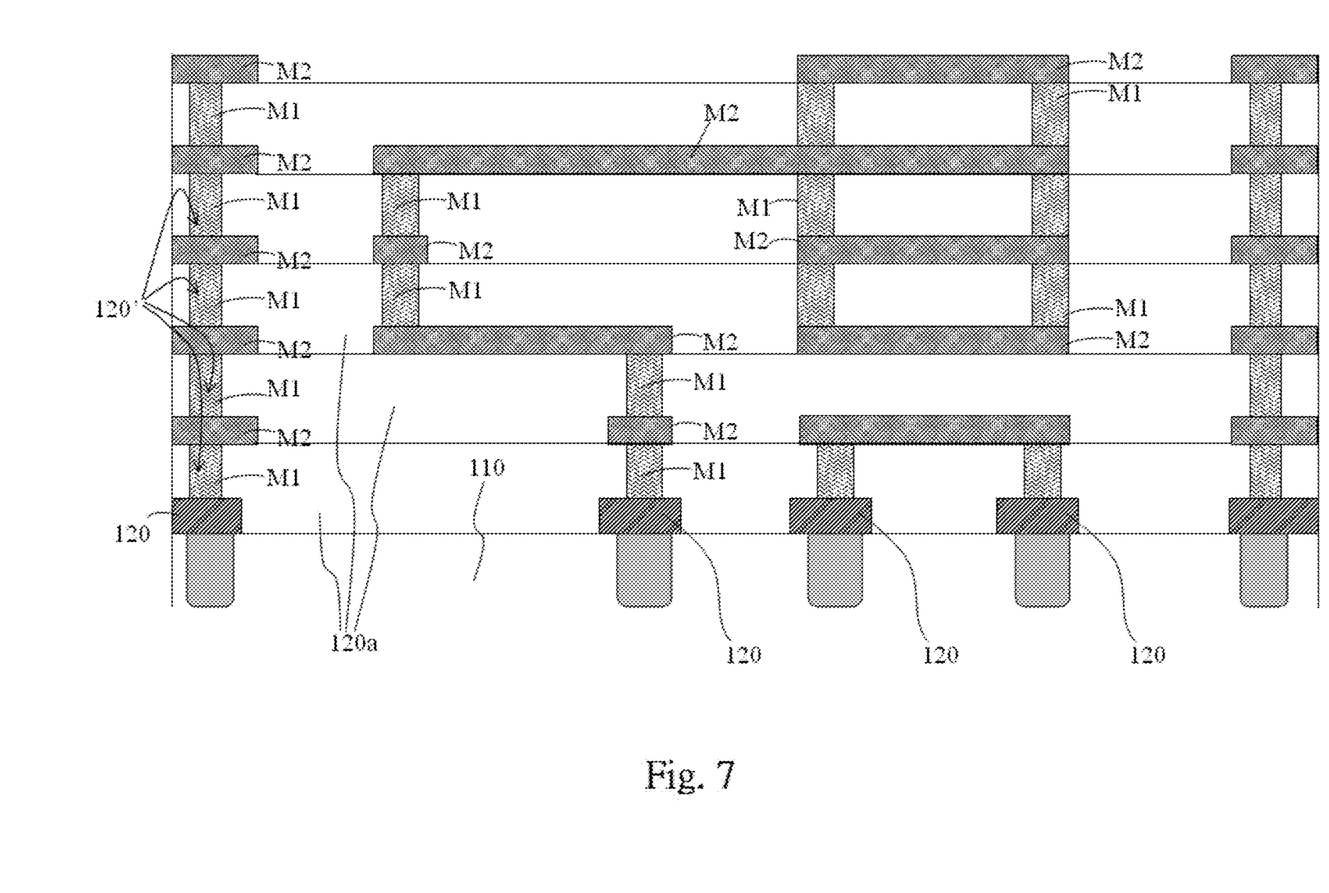
FIG. 7 shows a cross-section view of the manufactured micro-electro-mechanical sensing device according to an embodiment of the present invention.

First, provide a substrate 110, and form a semiconductor layer 120 on or above the substrate 110, wherein the semiconductor layer 120 is formed by first forming a semiconductor material layer on or above the substrate 110 and then patterning the semiconductor material layer. Next, repeatedly forming a dielectric layer 120a, a patterned metal layer M1, and a second patterned metal layer M2 on or above the substrate 110, wherein each first patterned metal layer M1 physically connects a second patterned metal layer M2 or the semiconductor layer 120 through at least one opening 120' of each dielectric layer 120a, as shown in FIG. 7.

Next, removing the dielectric layers 120a on or above the substrate 110 to form the aforementioned supporting pillar 130, the aforementioned first suspended arm 140, the aforementioned first connecting member 150, the aforementioned second suspended arm 160, and the aforementioned proof mass 170 on or above the substrate 110, as shown in FIG. 1. In this embodiment, the dielectric layer 120a is removed for example by vapor hydrofluoric acid (vapor HF). Thus, the steps for manufacturing the micro-electro-mechanical sensing device 100 are completed.

The micro-electro-mechanical sensing devices 100a-100c and 300 can be made by a similar way, by repeatedly forming the dielectric layer 120a, the first patterned metal layer M1 and the second patterned metal layer M2 on or above the substrate 110. Except, the positions of the openings in the dielectric layer 120a, or the patterns and locations of the first patterned metal layer M1 and the pattern of the second patterned metal layer M2 may be different.

Figure 8A:
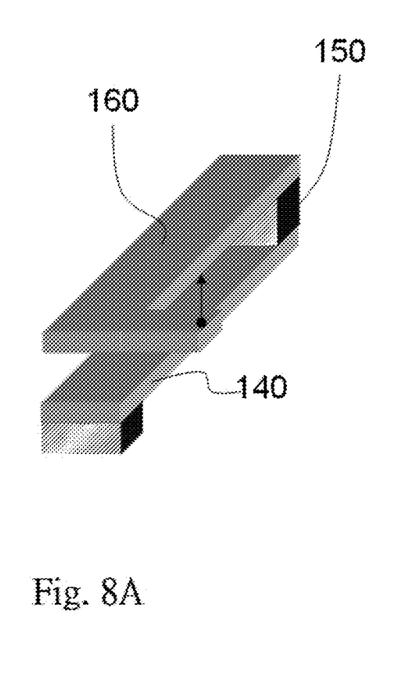
FIGS. 8A-8E show three-dimensional views of different embodiment species of the flexible structure according to the present invention.
Figures 8B, 8C:
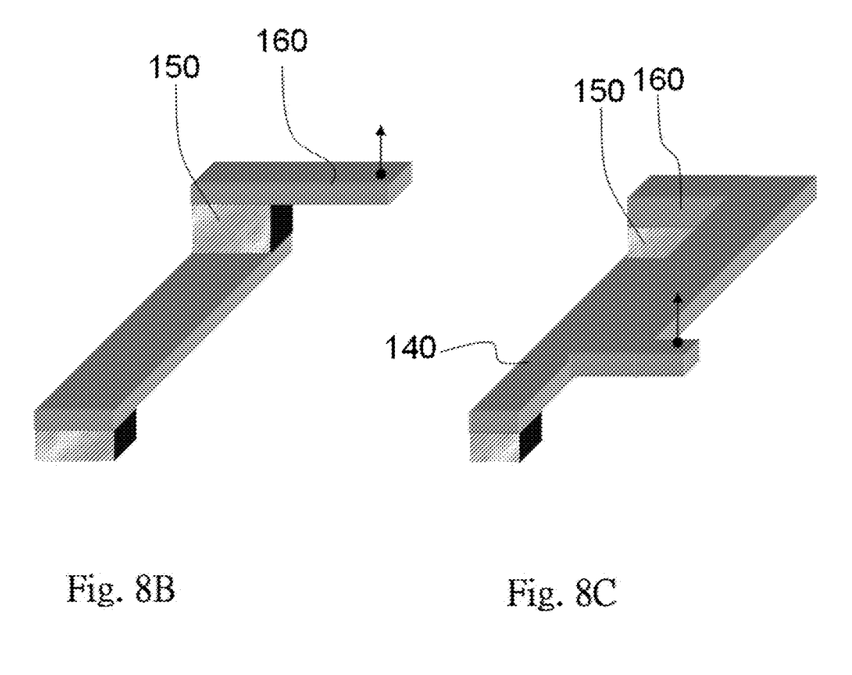

FIG. 8A-FIG. 8E show three-dimensional views of different embodiment species of the flexible structure according to the present invention. Please refer to FIG. 8A-FIG. 8C, which show embodiments wherein the number of the first connecting member 150 for connecting the first suspended arm 140 and the second suspended arm 160 is one, and the first connecting member 150 connects one end of the first suspended arm 140. More specifically, FIG. 8A shows an embodiment wherein the second suspended arm 160 is above the first suspended arm 140; FIG. 8B and FIG. 8C respectively show embodiments wherein the second suspended arm 160 is not above the first suspended arm 140. The second suspended arm 160 shown in FIG. 8C extends along one direction and then bends to another direction. The second suspended arm 160 shown in FIG. 8B extends only along one direction which is different from the extension direction of the first suspended arm 140.

Figure 8D:
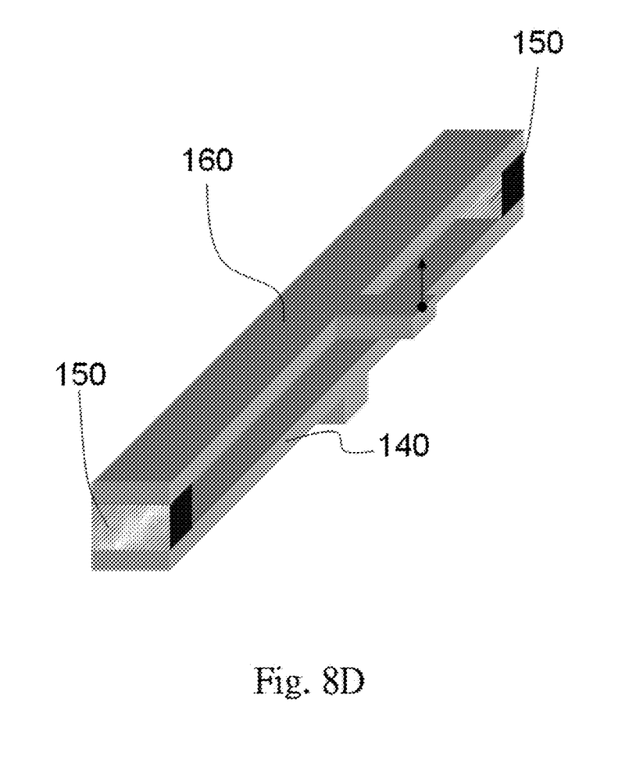
Figure 8E:
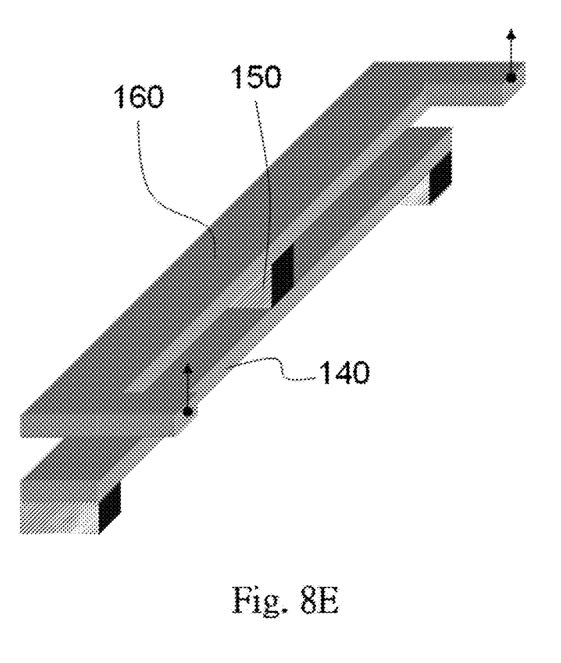

Referring to FIG. 8D and FIG. 8E, FIG. 8D shows an embodiment wherein the number of the first connecting members 150 for connecting the first suspended arm 140 and the second suspended arm 160 is two; these two first connecting members 150 respectively connect two ends of the first suspended arm 140, and the second suspended arm 160 is disposed above the first suspended arm 140. FIG. 8E shows an embodiment wherein the number of the first connecting member 150 for connecting the first suspended arm 140 and the second suspended arm 160 is one; the first connecting member 150 connects a middle portion between two ends of the first suspended arm 140, and the second suspended arm 160 is disposed above the first suspended arm 140.

As shown by the above, the flexible structure connecting the proof masses of the foregoing micro-electro-mechanical sensing device 100, 100a-100c, and 300 for example can use any one or more of the structures shown in FIG. 8A~FIG. 8E.

In summary, the method of manufacturing a micro-electro-mechanical sensing device according to the present invention includes at least the following features: first, the micro-electro-mechanical sensing device has a flexible structure which connects the first suspended arm and the second suspended arm at different elevation levels to the proof mass by a connecting member which utilizes the Z-axis space. In this way, the utilization efficiency of the substrate surface area can be effectively improved due to efficiently using the z-axis space, and the thermal and stress impacts on the flexible structure can be reduced. In addition, the flexible structure can be manufactured by a standard CMOS process, so the process of manufacturing the micro-electro-mechanical sensing device is simplified and the cost is reduced.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention, which should belong to the scope of the present invention. One embodiment or one claim of the present invention does not have to achieve all the objectives or advantages or include all the features of the present invention. The title and the abstract are provided for assisting searches and should not be read as limitations to the present invention.

What is claimed is:

1. A micro-electro-mechanical sensing device, comprising:
    a substrate;
    a semiconductor layer, disposed on or above the substrate;
    a supporting pillar, disposed on or above the semiconductor layer;
    a first suspended arm, disposed on the supporting pillar, wherein the supporting pillar connects a portion of the first suspended arm;
    a first connecting member, which directly or indirectly connects another portion of the first suspended arm;
    a second suspended arm including a first surface and a second surface opposite to the first surface, wherein the first connecting member connects a portion of the first surface; and
    a proof mass, which connects the second suspended arm, and which includes a portion of the second suspended arm as a portion of the proof mass;
    wherein a projection of the supporting pillar and a projection of the first connecting member do not overlap in an out-of-plane direction of the substrate, whereby the supporting pillar, the first suspended arm, the first connecting member and the second suspended arm form a folded structure.

2. A device of claim 1, wherein the first suspended arm includes a third surface and a fourth surface opposite to the third surface, and the supporting pillar connects a portion of the third surface.

3. A device of claim 2, wherein the first connecting member directly connects a portion of the fourth surface or another portion of the third surface.

4. A device of claim 3, wherein when the first connecting member directly connects another portion of the third surface, the first connecting member is at a same elevation level as at least a portion of the supporting pillar.

5. A device of claim 3, wherein when the first connecting member directly connects a portion of the fourth surface, the proof mass has a portion which is at a same elevation level as a portion of the first connecting member.

6. A device of claim 2, further comprising:
a second connecting member, directly connecting another portion of the third surface of the first suspended arm; and
a third suspended arm including a fifth surface and a sixth surface opposite to the fifth surface, wherein the second connecting member connects a portion of the fifth surface, and the first connecting member connects another portion of the fifth surface, such that the first connecting member indirectly connects another portion of the first suspended arm.

7. A device of claim 6, wherein the first connecting member and the second connecting member are at a same elevation level as at least a portion of the supporting pillar.

8. A device of claim 6, wherein the proof mass has a portion which is at a same elevation level as a portion of the first connecting member, a portion of the second connecting member, or a portion of the supporting pillar.

9. A device of claim 1, wherein each of the supporting pillar, the first connecting member, and the proof mass includes at least two conductive layers.

10. A device of claim 9, wherein a dielectric layer or a gap is provided between the conductive layers of the proof mass.

11. A device of claim 1, further comprising:
an etching barrier structure, which surrounds the supporting pillar, the first suspended arm, the first connecting member, the second suspended arm, and the proof mass.

12. A device of claim 11, wherein the etching barrier structure includes a stacked structure having at least two conductive layers.

13. A device of claim 12, wherein the etching barrier structure include layers having same elevation levels as the semiconductor layer, the supporting pillar, the first suspended arm, and the first connecting member, the second suspended arm, and the proof mass.

14. A device of claim 1, further comprising:
a top electrode, disposed above the proof mass.

15. A device of claim 1, further comprising:
a bottom electrode, disposed beneath the proof mass.

16. A device of claim 1, further comprising:
a piezoelectric layer, disposed on the second suspended arm.

17. A device of claim 1, wherein the second suspended arm includes a piezoelectric material.

18. A micro-electro-mechanical sensing device, comprising:
a substrate;
a semiconductor layer, disposed on or above the substrate;
a supporting pillar, disposed on or above the semiconductor layer;
a first suspended arm, disposed on the supporting pillar, wherein the supporting pillar connects a portion of the first suspended arm;
a first connecting member, which directly or indirectly connects another portion of the first suspended arm;
a second suspended arm including a first surface and a second surface opposite to the first surface, wherein the first connecting member connects a portion of the first surface; and
a proof mass, which connects the second suspended arm, and which includes a portion of the second suspended arm as a portion of the proof mass, the proof mass including at least two conductive layers;
wherein a projection of the first suspended arm and a projection of the second suspended arm overlap in an out-of-plane direction of the substrate.

19. A micro-electro-mechanical sensing device, comprising:
a substrate;
a semiconductor layer, disposed on or above the substrate;
a supporting pillar, disposed on or above the semiconductor layer;
a first suspended arm, disposed on the supporting pillar, wherein the supporting pillar connects a portion of the first suspended arm;
a first connecting member, which directly or indirectly connects another portion of the first suspended arm;
a second suspended arm including a first surface and a second surface opposite to the first surface, wherein the first connecting member connects a portion of the first surface; and
a proof mass, which connects the second suspended arm, and which includes a portion of the second suspended arm as a portion of the proof mass, the proof mass including at least two conductive layers;
wherein the first suspended arm is connected to the proof mass through the second suspended arm in between.

* * * * *